(12) United States Patent
Koo et al.

(10) Patent No.: US 10,664,355 B2
(45) Date of Patent: May 26, 2020

(54) DATA STORAGE DEVICE PERFORMING RECOVERY OPERATION AFTER SUDDEN POWER-OFF AND OPERATING METHOD THEREOF

(71) Applicant: SK hynix Inc., Gyeonggi-do (KR)

(72) Inventors: Duck Hoi Koo, Gyeonggi-do (KR); Seung Gu Ji, Seoul (KR)

(73) Assignee: SK hynik Inc., Gyeonggi-do (KR)

( * ) Notice: Subject to any disclaimer, the term of this patent is extended or adjusted under 35 U.S.C. 154(b) by 186 days.

(21) Appl. No.: 15/829,081

(22) Filed: Dec. 1, 2017

(65) Prior Publication Data
US 2018/0336104 A1 Nov. 22, 2018

(30) Foreign Application Priority Data
May 16, 2017 (KR) .................... 10-2017-0060506

(51) Int. Cl.
| | | |
|---|---|---|
| *G06F 11/07* | (2006.01) | |
| *G06F 11/14* | (2006.01) | |
| *G06F 12/02* | (2006.01) | |
| *G11C 29/04* | (2006.01) | |

(52) U.S. Cl.
CPC ...... *G06F 11/1458* (2013.01); *G06F 11/1417* (2013.01); *G06F 12/0246* (2013.01); *G06F 2201/805* (2013.01); *G06F 2201/82* (2013.01); *G06F 2212/7209* (2013.01); *G11C 2029/0407* (2013.01)

(58) Field of Classification Search
CPC ............... G06F 12/0646; G06F 12/16; G06F 12/00246; G06F 12/0292; G06F 2212/7205; G06F 2212/7209; G06F 12/0246; G06F 2201/82; G11C 29/70; G11C 29/88; G11C 2029/407; G11C 29/886
See application file for complete search history.

(56) References Cited

U.S. PATENT DOCUMENTS

| | | | | |
|---|---|---|---|---|
| 2008/0104308 A1* | 5/2008 | Mo | ...................... | G06F 12/0246 711/103 |
| 2013/0067146 A1* | 3/2013 | Zettsu | ...................... | G06F 12/02 711/103 |
| 2013/0151892 A1* | 6/2013 | Huang | ................ | G06F 12/0246 714/14 |
| 2016/0132253 A1* | 5/2016 | Chiu | ...................... | G06F 3/0608 711/103 |
| 2017/0031615 A1* | 2/2017 | Lee | ...................... | G06F 11/1068 |
| 2017/0060768 A1* | 3/2017 | Zhang | .................. | G06F 3/0619 |

FOREIGN PATENT DOCUMENTS

| | | |
|---|---|---|
| KR | 1020140053309 | 5/2014 |
| KR | 101573370 | 12/2015 |

* cited by examiner

*Primary Examiner* — Joseph O Schell
(74) *Attorney, Agent, or Firm* — IP & T Group LLP

(57) ABSTRACT

A data storage device includes a nonvolatile memory device; and a controller suitable for: performing a recovery operation for the nonvolatile memory device in response to a sudden power-off based on a recovery state of the nonvolatile memory device; updating the recovery state of the nonvolatile memory device while performing the recovery operation to a predetermined recovery state after performing a repair operation for at least one open memory block of the nonvolatile memory device in the recovery operation; and performing a write operation from after a position where the repair operation is performed in the at least one open memory block, in the predetermined recovery state.

20 Claims, 12 Drawing Sheets

DATA STORAGE DEVICE PERFORMING RECOVERY OPERATION AFTER SUDDEN POWER-OFF AND OPERATING METHOD THEREOF

CROSS-REFERENCES TO RELATED APPLICATION

The present application claims priority under 35 U.S.C. § 119(a) to Korean application number 10-2017-0060506, filed on May 16, 2017, which is incorporated herein by reference in its entirety.

BACKGROUND

1. Technical Field

Various embodiments generally relate to a data storage device and, more particularly, to a data storage device including a nonvolatile memory device.

2. Related Art

Data storage devices store data provided by an external device in response to a write request. Data storage devices may also provide stored data to an external device in response to a read request. Examples of external devices that use data storage devices include computers, digital cameras, cellular phones and the like. Data storage devices may be embedded in an external device during manufacturing of the external devices or may be fabricated separately and then connected afterwards to an external device.

SUMMARY

In an embodiment, a data storage device may include: a nonvolatile memory device; and a controller suitable for: performing a recovery operation for the nonvolatile memory device in response to a sudden power-off based on a recovery state of the nonvolatile memory device; updating the recovery state of the nonvolatile memory device while performing the recovery operation to a predetermined recovery state after performing a repair operation for at least one open memory block of the nonvolatile memory device in the recovery operation; and performing a write operation from after a position where the repair operation is performed in the at least one open memory block, in the predetermined recovery state.

In an embodiment, a method for operating a data storage device may include: starting a recovery operation depending on a recovery state for a nonvolatile memory device including a plurality of memory blocks, in response to a sudden power-off; updating the recovery state to a predetermined recovery state after performing a repair operation for at least one open memory block; and performing a write operation from after a position where the repair operation is performed in the open memory block, in the predetermined recovery state.

BRIEF DESCRIPTION OF THE DRAWINGS

The above and other features and advantages of the present invention will become more apparent to those skilled in the art to which the present invention belongs by describing various embodiments thereof with reference to the attached drawings in which.

DETAILED DESCRIPTION

Figure 1:
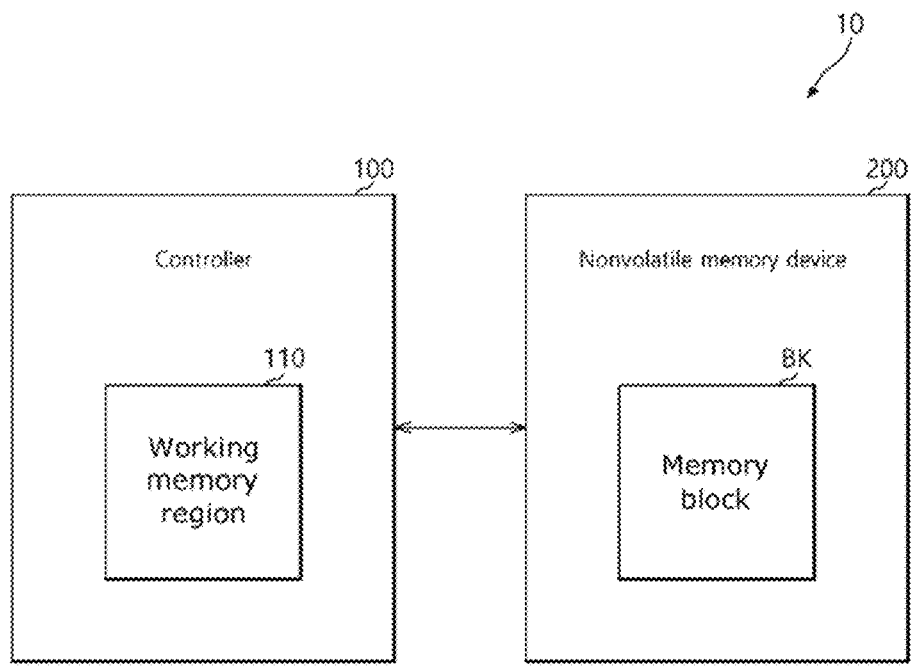
FIG. 1 is a block diagram illustrating a data storage device in accordance with an embodiment.

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means, only A, or only B, or only C, or any combination of A, B, and C.

The term "or" as used herein means either one of two or more alternatives but not both nor any combinations thereof.

As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a data storage device 10 in accordance with an embodiment.

The data storage device 10 may be configured to store data provided from an external device, in response to a write request from the external device. Also, the data storage device 10 may be configured to provide stored data to the external device, in response to a read request from the external device.

The data storage device 10 may be prepared in the form of a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The data storage device 10 may include a controller 100 and a nonvolatile memory device 200.

The controller 100 may control general operations of the data storage device 10. For example, the controller 100 may store data in the nonvolatile memory device 200, and read data from the nonvolatile memory device 200.

If a sudden power-off occurs during the operation of the data storage device 10, the controller 100 may perform a recovery operation when the data storage device 100 is booted as power is supplied again to the data storage device 10. The controller 100 may start the recovery operation depending on a recovery state for the nonvolatile memory device 200, in response to the sudden power-off. The controller 100 can perform the recovery operation and update the recovery state in real time while performing the recovery operation. Hence, the recovery state is updated at all times and indicates to which stage the recovery operation due to the sudden power-off has progressed. Therefore, even if another sudden power-off occurs while performing the recovery operation, the controller 100 may determine from which step the recovery operation should be performed, based on a previously updated and stored recovery state.

At least one "open" memory block BK may be selected among a plurality of memory blocks (not shown) included in the nonvolatile memory device 200 to store data. An open memory block BK is a memory block which includes an empty region capable of storing data. The open memory block BK may become a "closed" memory block when it no longer includes an empty region. In other words, a closed memory block is a memory block which is full of data through a write operation.

The recovery operation may include a repair operation for the open memory block BK. The repair operation may process a region which becomes unstable due to a sudden power-off in the open memory block BK so that the open memory block BK may be continuously used in the write operation. Namely, the controller 100 may continue to perform the write operation after a position where the repair operation is performed in the open memory block BK.

The repair operation may be performed within a shorter time than existing operations. Therefore, when compared to a conventional recovery method in which a garbage collection operation or the like is performed for an open memory block, the recovery operation may be completed substantially faster. A concrete method for performing such a recovery operation will be described later in detail.

The controller 100 may include a working memory region 110. The working memory region 110 may store various data necessary for the controller 100 to operate. For example, the working memory region 110 may store various map data for logical addresses and physical addresses.

The nonvolatile memory device 200 may store data transmitted from the controller 100 and read out stored data and transmit read-out data to the controller 100, according to control of the controller 100. The nonvolatile memory device 200 may include a plurality of memory blocks including the memory block BK.

The nonvolatile memory device 200 may be any suitable nonvolatile memory device including, for example, a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

While it is illustrated in FIG. 1 that the data storage device 10 includes one nonvolatile memory device 200, it is to be noted that the number of nonvolatile memory devices included in the data storage device 10 is not limited thereto.

Figure 2:
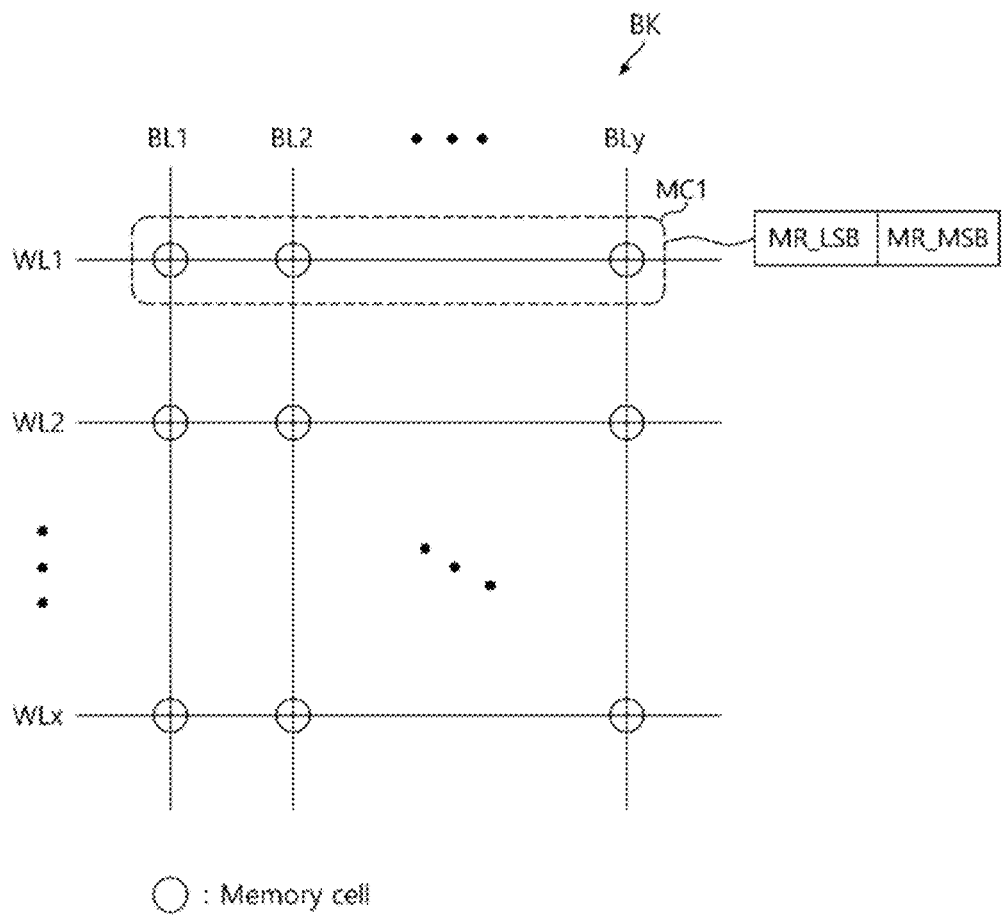
FIG. 2 is a diagram schematically illustrating the structure of a memory block.

FIG. 2 schematically illustrates a structure of the memory block BK as an example.

Referring to FIG. 2, the memory block BK may include a plurality of memory cells which are coupled to a plurality of word lines WL1 to WLx and a plurality of bit lines BL1 to BLy. While FIG. 2 schematically illustrates memory cells which are disposed in a two-dimensional array, it is to be noted that memory cells may be disposed in a three-dimensional array as is well known in the art. The nonvolatile memory device 200 may select any one among the plurality of word lines WL1 to WLx, and perform an operation for the memory cells of a selected word line. The operation may be, for example, a write or a read operation. The bit lines BL1 to BLy may be used in transmitting data to and from the memory cells in the write operation and the read operation.

In order to store data in the memory block BK, the controller 100 may select the word lines WL1 to WLx according to a predetermined write sequence, for example, sequentially from the word line WL1 to the word line WLx. For example, the controller 100 may perform a write operation for the memory cells coupled to the word line WL1, and then perform a write operation for the memory cells coupled to the word line WL2 and so on and so forth.

When k number of bits are stored in each of the memory cells, the memory cells coupled to a single word line may correspond to k number of memory regions. The k number of bits stored in each of the memory cells may be stored in the k number of memory regions, respectively.

For example, when two bits are stored in each of the memory cells, memory cells MC1 coupled to the word line WL1 may correspond to two memory regions MR_LSB and MR_MSB. The lower bit of the two bits stored in each of the memory cells may be stored in the LSB (least significant bit) memory region MR_LSB, and the upper bit of the two bits may be stored in the MSB (most significant bit) memory region MR_MSB.

Figure 3A:
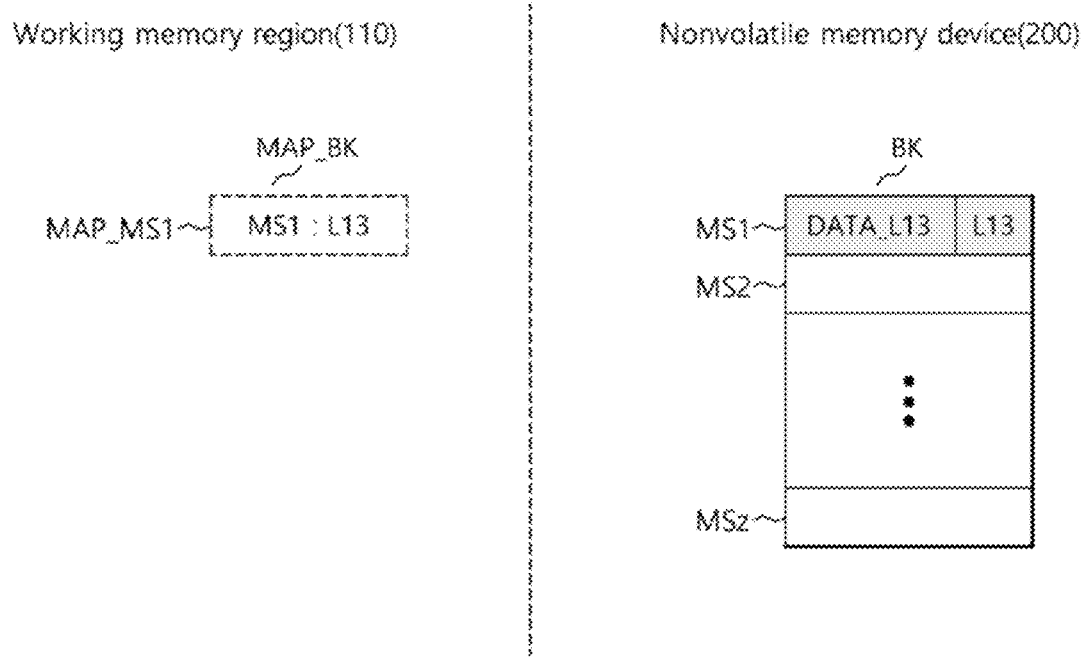
FIGS. 3A and 3B are exemplary diagrams illustrating a method for a controller to generate block map data.
Figure 3B:
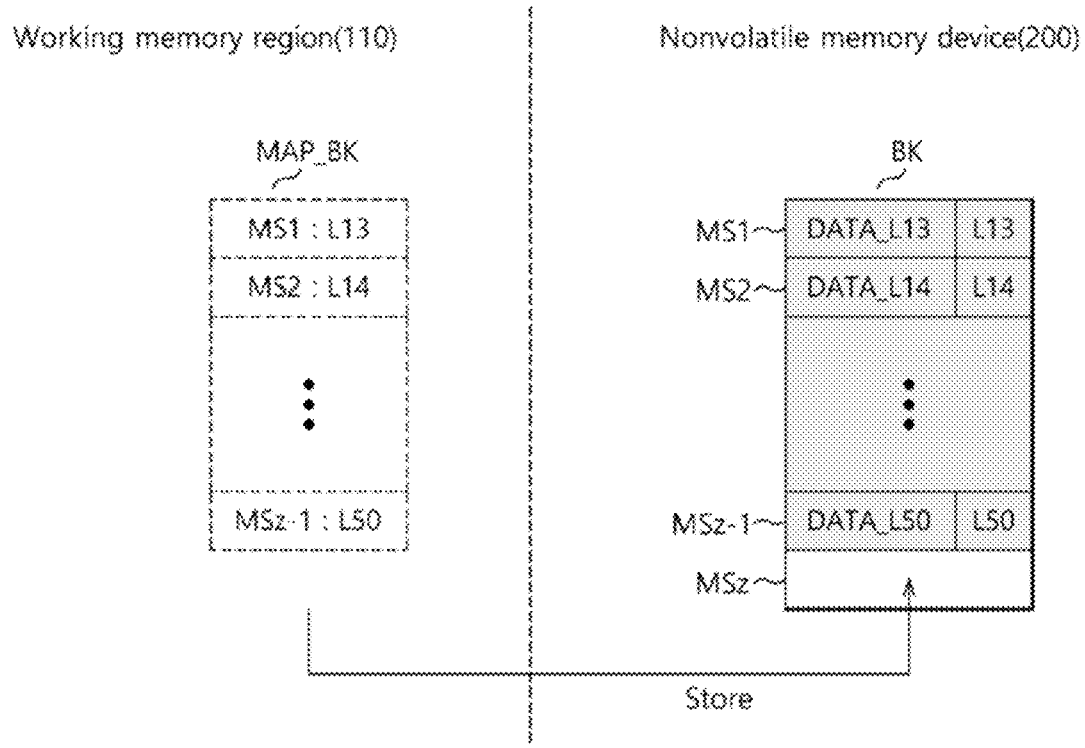

FIGS. 3A and 3B exemplarily illustrate a method of generating block map data MAP_BK.

Referring to FIG. 3A, the memory block BK may include memory segments MS1 to MSz divided in units of address mapping. A memory segment may be a memory unit mapped to a logical address which is recognized by a host device. A single memory segment may be mapped to a single logical address. For example, the size of the memory segment may correspond to the size of the memory region of FIG. 2. For another example, the size of the memory segment may be smaller than the size of the memory region of FIG. 2. For another example, the size of the memory segment may be larger than the size of the memory region of FIG. 2.

For example, an address mapping method may include the controller 100 mapping the memory segment MS1 to a logical address L13, and write data DATA_L13 corresponding to the logical address L13 in the memory segment MS1. The controller 100 may store the logical address L13 together in the memory segment MS1 while storing the data DATA_L13 in the memory segment MS1. Meanwhile, at this time, the memory block BK may be an open memory block.

The controller 100 may retain the block map data MAP_BK of the open memory block BK in the working memory region 110. The controller 100 may store map data MAP_MS1 regarding the memory segment MS1, as the block map data MAP_BK, while storing the data DATA_L13 in the memory segment MS1. The map data MAP_MS1 may include the logical address L13 mapped to the memory segment MS1. As a write operation is performed for the open memory block BK, the block map data MAP_BK may include the logical addresses mapped to the memory segments MS1 to MSz.

Referring to FIG. 3B there is shown the block map data MAP_BK stored in the working memory region 110 when the write operation is performed for the memory segments MS1 to MSz−1. The controller 100 may store the block map data MAP_BK in the last memory segment MSz when the write operation is performed for the remaining memory segments MS1 to MSz−1 except for the last memory segment MSz. The last memory segment MSz may be a block map data memory region for storing the block map data MAP_BK of the memory block BK. According to an embodiment, the block map data memory region may be a plurality of memory segments, unlike that shown in FIG. 3B. According to an embodiment, the block map data memory region may be a position other than a lastly written position in the memory block BK. According to an embodiment, the block map data memory region of the memory block BK may be positioned in a memory block other than the memory block BK.

In summary, the block map data MAP_BK stored in the working memory region 110 may be stored in the block map data memory region MSz when the open memory block BK is closed. As will be described below, the block map data MAP_BK stored in the block map data memory region MSz may be used for a map data flush operation.

Figure 4A:
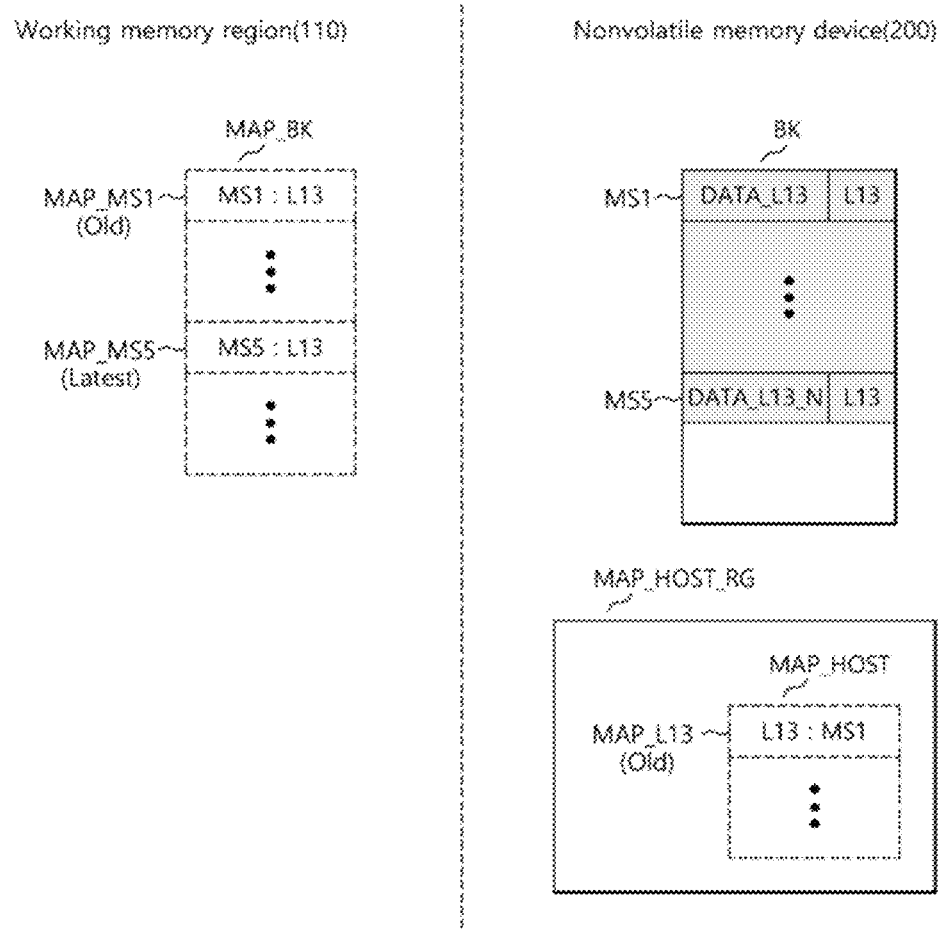
FIGS. 4A and 4B are exemplary diagrams illustrating a method for performing a map data flush operation.
Figure 4B:
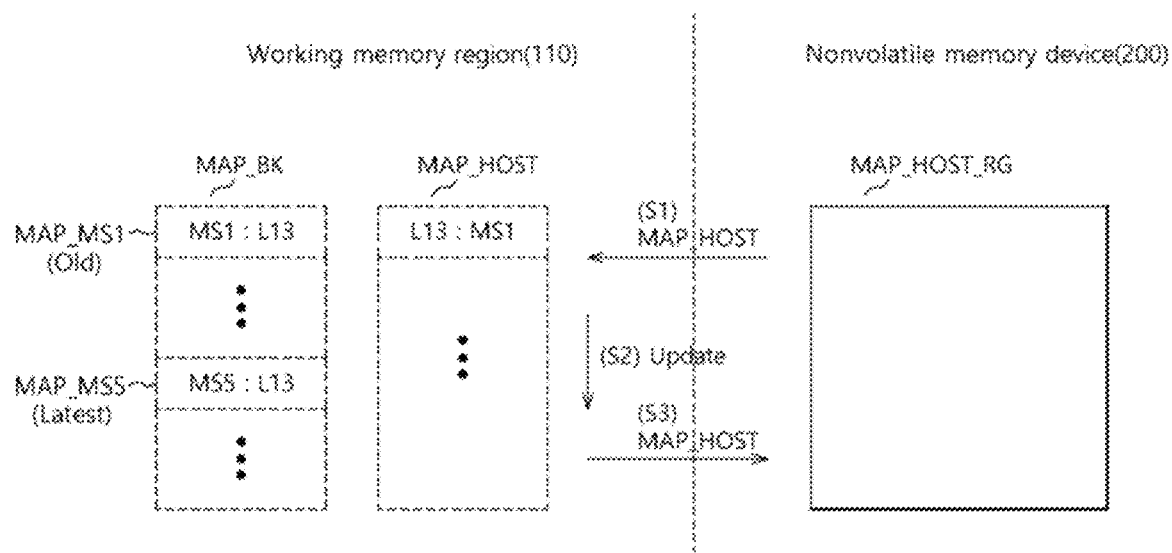

FIGS. 4A and 4B exemplarily illustrate a method of performing a map data flush operation.

Referring to FIG. 4A, the controller 100 may store host map data MAP_HOST in a host map data memory region MAP_HOST_RG. The host map data MAP_HOST may include information of the memory segments mapped to all logical addresses which are managed by the host device. The host map data MAP_HOST may become old map data when data is updated.

For example, map data MAP_L13 relating to the logical address L13 may include information of the memory segment MS1 which has been mapped to the logical address L13 in FIG. 3A. Thereafter, when the data DATA_L13 corresponding to the logical address L13 is updated to latest data DATA_L13_N and is stored in the memory segment MS5 of the memory block BK, the map data MAP_L13 may become old map data.

On one hand, map data MAP_MS5 of the block map data MAP_BK, relating to the memory segment MS5, includes the logical address L13 mapped to the memory segment MS5, and may be latest map data. On the other hand, the map data MAP_MS1 relating to the memory segment MS1 in the block map data MAP_BK may become old map data.

Referring to FIG. 4B, the controller 100 may perform a map data flush operation for the block map data MAP_BK, to update the host map data MAP_HOST to a latest state.

For example, at step S1, the controller 100 may read the host map data MAP_HOST from the host map data memory region MAP_HOST_RG to the working memory region 110. At step S2, the controller 100 may update the old map data MAP_L13 included in the host map data MAP_HOST, based on the block map data MAP_BK including the latest map data MAP_MS5. Then, at step S3, the controller 100 may store the updated host map data MAP_HOST in the host map data memory region MAP_HOST_RG.

Meanwhile, the controller 100 may perform the map data flush operation for the block map data MAP_BK, after the memory block BK is closed. The controller 100 may perform the map data flush operation based on the block map data MAP_BK which is still stored in the working memory region 110. According to an embodiment, the map data flush operation may be performed based on the block map data MAP_BK stored in the last memory segment MSz of the memory block BK described above with reference to FIG. 3B.

Figure 5:
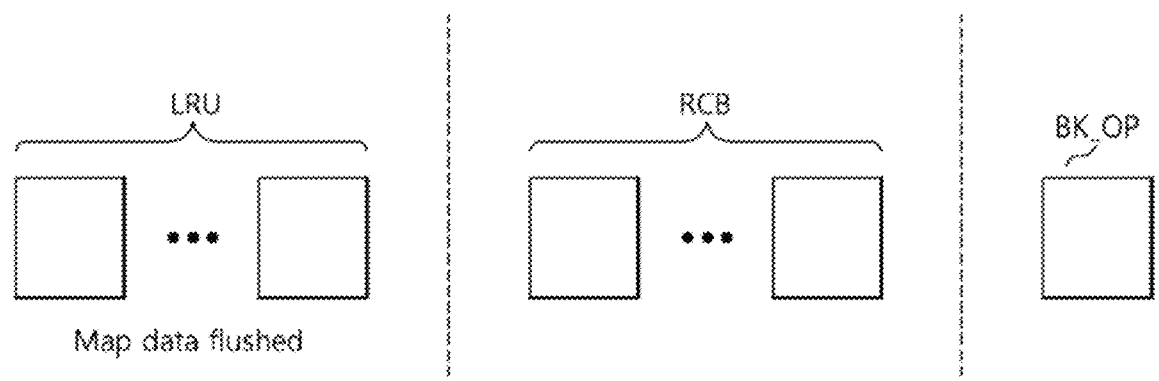
FIG. 5 is a diagram illustrating a first recovery state of the data storage device.

FIG. 5 illustrates a situation when the data storage device 10 shown in FIG. 1 is in a first recovery state when an SPO occurs. FIG. 5 exemplarily illustrates memory blocks LRU, RCB and BK_OP arranged in the sequence in which they are used in the write operation in the nonvolatile memory device 200.

Referring to FIG. 5, the memory block BK_OP may be currently open. The memory blocks LRU and RCB may be memory blocks which were previously used in the write operation and are now closed. One or more memory blocks LRU may be memory blocks for which the map data flush operation is performed. That is to say, the block map data of the memory blocks LRU may be flushed to the host map data MAP_HOST. One or more memory blocks RCB may be memory blocks which are more recently closed than the memory blocks LRU, and include at least one memory block for which the map data flush operation is not performed. The difference between the memory blocks LRU and the memory blocks RCB may be that the completion of the map data flush operation for the memory blocks LRU is fully guaranteed and the completion of the map data flush operation for the memory blocks RCB is not guaranteed. In other words, the map data flush operation for a certain memory block of the memory blocks RCB may have been performed.

The controller 100 may manage the memory blocks RCB in an RCB list (not shown). The controller 100 may perform the map data flush operation for the memory blocks RCB according to a predetermined condition. The predetermined condition may be, for example, that a predetermined number of memory blocks RCB are included in the RCB list. The predetermined condition may be, for example, an elapse of a predetermined time. The memory blocks RCB may be removed from the RCB list after the map data flush operation is performed, but may not be removed from the RCB list immediately after the map data flush operation is performed.

Thus, as the case may be, the memory blocks RCB may include a memory block for which the map data flush operation is at least partially performed. For example, in the case where a sudden power-off occurs while the map data flush operation is performed, the map data flush operation may be interrupted after having been partially performed. If a memory block for which the map data flush operation is performed is not immediately removed from the RCB list, the memory blocks RCB included in the RCB list may include the memory block for which the map data flush operation is performed.

Figure 6A:
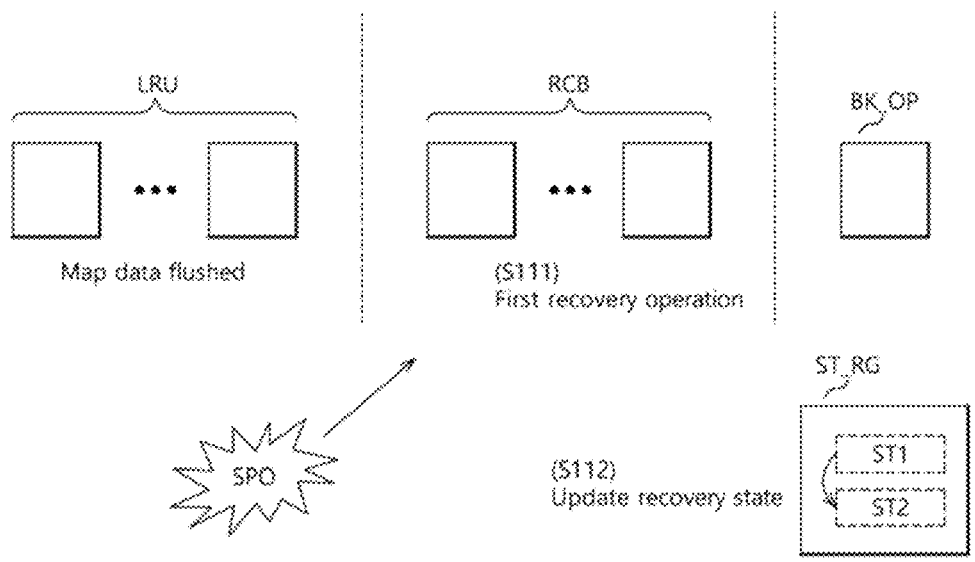
FIG. 6A is an explanatory diagram illustrating a method for starting a first recovery operation after a sudden power-off occurs in the first recovery state.

FIG. 6A illustrates a method for the controller 100 to start a first recovery operation after a sudden power-off occurs in a first recovery state ST1.

The data storage device 10 may be in the first recovery state ST1. The first recovery state ST1 may be a recovery state that is initially set when the data storage device 10 is manufactured as a product. A current recovery state may be stored in a state memory region ST_RG. The first recovery state ST1 may be sequentially updated to second to fourth recovery states as a recovery operation due to a sudden power-off is performed step by step as will be described later. If a sudden power-off does not occur during the operation of the data storage device 10, the data storage device 10 may be continuously kept in the first recovery state ST1.

Referring to FIG. 6A, at step S111, when it is determined in a booting operation that a sudden power-off SPO has occurred immediately before, the controller 100 may check by referring to the state memory region ST_RG that it is currently the first recovery state ST1, and start the first recovery operation. The first recovery operation may include the map data flush operation for the memory blocks RCB.

After completing the first recovery operation, at step S112, the controller 100 may update the first recovery state ST1 to a second recovery state ST2 in the state memory region ST_RG.

Figure 6B:
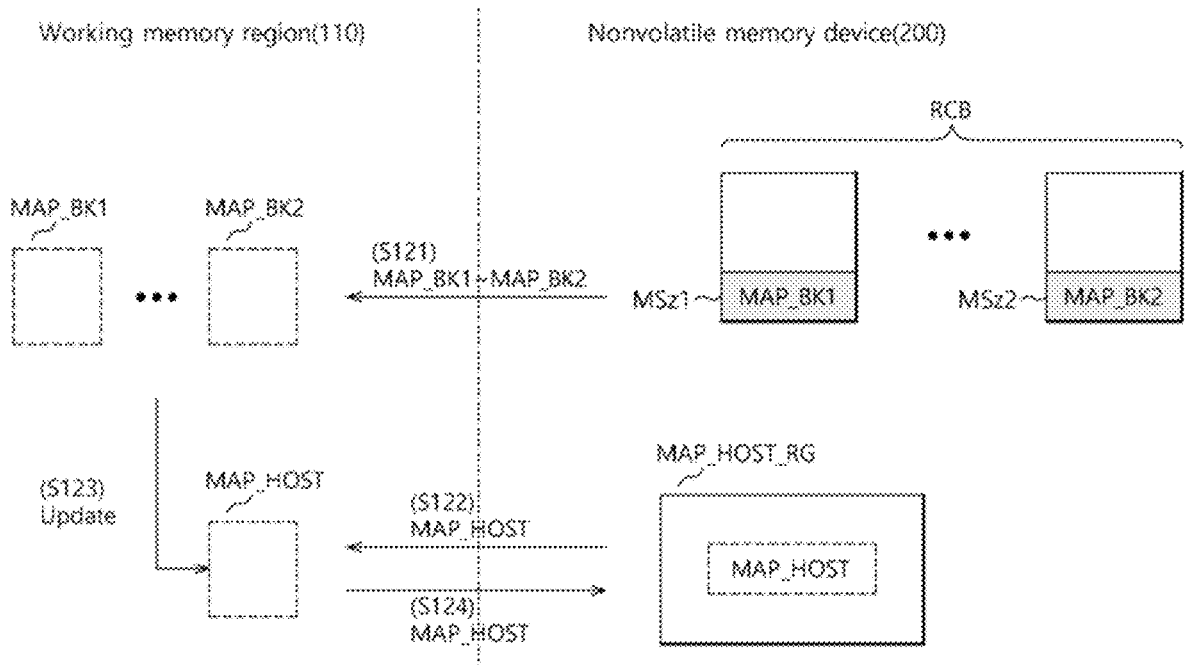
FIG. 6B is an explanatory diagram illustrating a method for performing the first recovery operation.

FIG. 6B illustrates in detail a method for the controller 100 to perform the first recovery operation. The first recovery operation may include the map data flush operation for the memory blocks RCB. The map data flush operation of FIG. 6B may be similar to the map data flush operation of FIG. 4B.

Referring to FIG. 6B, at step S121, the controller 100 may read block map data MAP_BK1 to MAP_BK2 which are stored in the memory blocks RCB, respectively. The block map data MAP_BK1 to MAP_BK2 may be stored in last memory segments MSz1 to MSz2 of the memory blocks RCB as exemplarily described above. As described above, the block map data MAP_BK1 to MAP_BK2 may include latest map information.

At step S122, the controller 100 may read the host map data MAP_HOST stored in the host map data memory region MAP_HOST_RG.

At step S123, the controller 100 may update the host map data MAP_HOST based on the block map data MAP_BK1 to MAP_BK2.

At step S124, the controller 100 may store the updated host map data MAP_HOST in the host map data memory region MAP_HOST_RG.

Figure 7A:
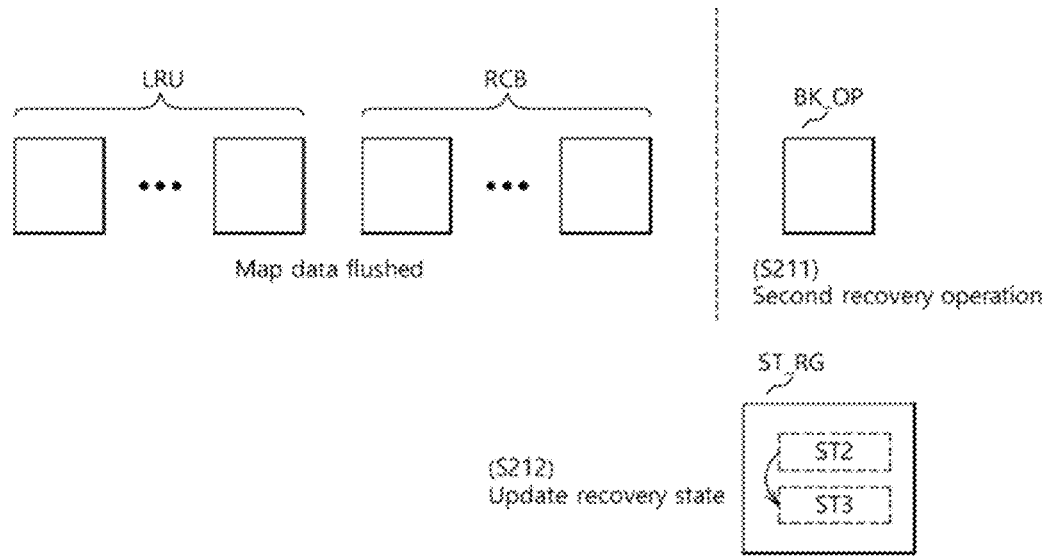
FIG. 7A is an explanatory diagram illustrating a method for performing a second recovery operation in a second recovery state.

FIG. 7A illustrates a method for the controller 100 to perform a second recovery operation in the second recovery state ST2. In FIG. 7A, the data storage device 10 may be in the second recovery state ST2 as is updated in FIG. 6A.

Referring to FIG. 7A, at step S211, the controller 100 may perform the second recovery operation in the second recovery state ST2. The second recovery operation may include a block map data recovery operation and a start log write operation for the currently open memory block BK_OP. In detail, the controller 100 may perform the block map data recovery operation to recover the block map data of the memory block BK_OP which is stored in the working memory region 110 immediately before the sudden power-off occurs. The controller 100 may perform the start log write operation to write information on a repair operation, before starting the repair operation for the memory block BK_OP.

After completing the second recovery operation, at step S212, the controller 100 may update the second recovery state ST2 to a third recovery state ST3 in the state memory region ST_RG.

Figure 7B:
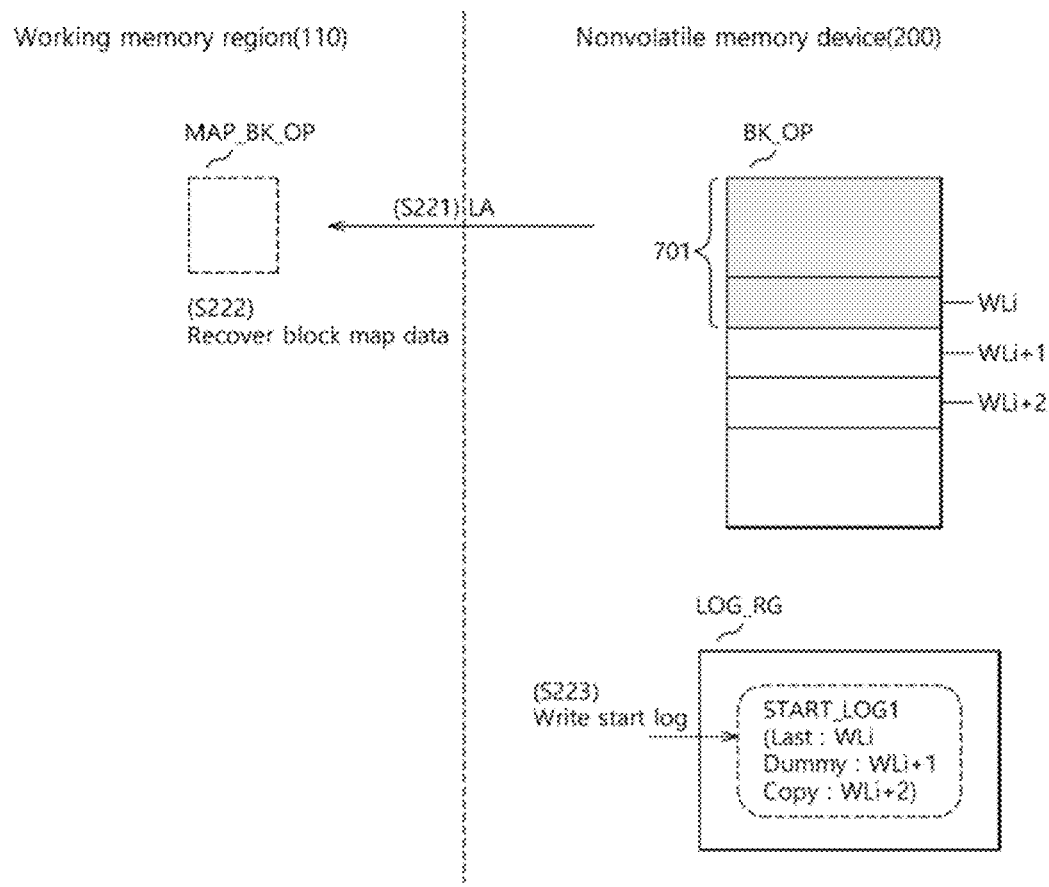
FIG. 7B is an explanatory diagram illustrating a method for performing the second recovery operation.

FIG. 7B illustrates in detail a method for the controller 100 to perform the second recovery operation. The second recovery operation may include the block map data recovery operation and the start log write operation for the open memory block BK_OP.

Referring to FIG. 7B, at step S221, the controller 100 may read logical addresses LA stored in regions 701 for which the write operation has already been performed in the memory block BK_OP. The logical addresses LA may be logical addresses which are respectively mapped to the memory segments included in the regions 701, as described above.

At step S222, the controller 100 may recover block map data MAP_BK_OP of the memory block BK_OP in the working memory region 110, based on the logical addresses LA.

At step S223, the controller 100 may write a start log START_LOG1 in a log memory region LOG_RG. The start log START_LOG1 may include information on a last word line WLi, that is, a word line for which the write operation is performed when the sudden power off occurs in the memory block BK_OP. The write operation for the last word line WLi may have been completed before the sudden power-off occurs, or may have been being performed at the moment when the sudden power-off occurs. Therefore, memory regions corresponding to the last word line WLi may store unstable data, and thus may be a target of the repair operation to be described below.

In addition, the start log START_LOG1 may further include information on a dummy word line WLi+1 and/or a copy word line WLi+2 associated with the repair operation. The dummy word line WLi+1 may be a word line which is subsequent to the last word line WLi according to the write sequence, and may be a word line for which a dummy write operation is performed in the repair operation to be described below. The copy word line WLi+2 may be a word line which is subsequent to the dummy word line WLi+1 according to the write sequence, and may be a target word line for which a copy write operation is performed in the repair operation to be described below.

As will be described below, the start log START_LOG1 may be used to discard the existing copy word line WLi+2 and designate a new copy word line in the case where a subsequent sudden power-off occurs while the repair operation is performed.

Figure 8A:
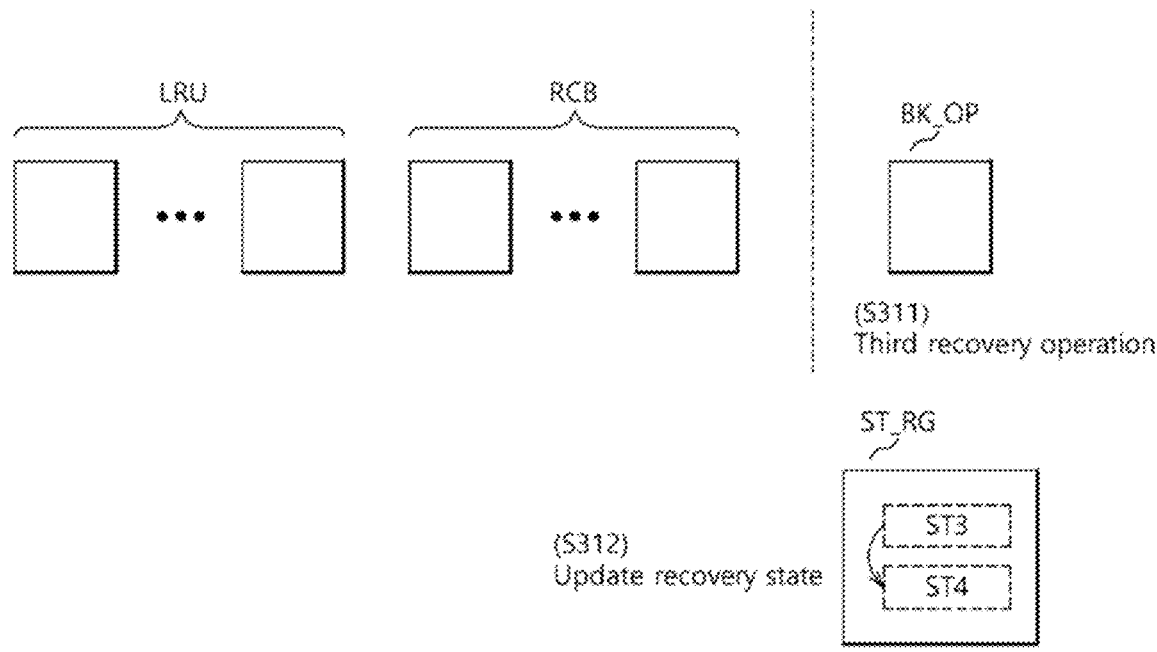
FIG. 8A is an explanatory diagram illustrating a method for performing a third recovery operation in a third recovery state.

FIG. 8A illustrates a method for the controller 100 to perform a third recovery operation in the third recovery state ST3. In FIG. 8A, the data storage device 10 may be in the third recovery state ST3 as is updated in FIG. 7A.

Referring to FIG. 8A, the controller 100 may perform the third recovery operation in the third recovery state ST3. The third recovery operation may include the repair operation, the map data flush operation and an end log write operation for the open memory block BK_OP. In detail, at step S311, the controller 100 may perform the repair operation to recover data and memory regions placed under an unstable state due to the sudden power-off in the open memory block BK_OP, to a stable state. The controller 100 may perform the map data flush operation for the block map data MAP_BK_OP of the memory block BK_OP recovered beforehand in the second recovery operation. The controller 100 may perform the end log write operation to write information on the repair operation performed for the open memory block BK_OP.

After completing the third recovery operation, at step S312, the controller 100 may update the third recovery state ST3 to a fourth recovery state ST4 in the state memory region ST_RG.

Figure 8B:
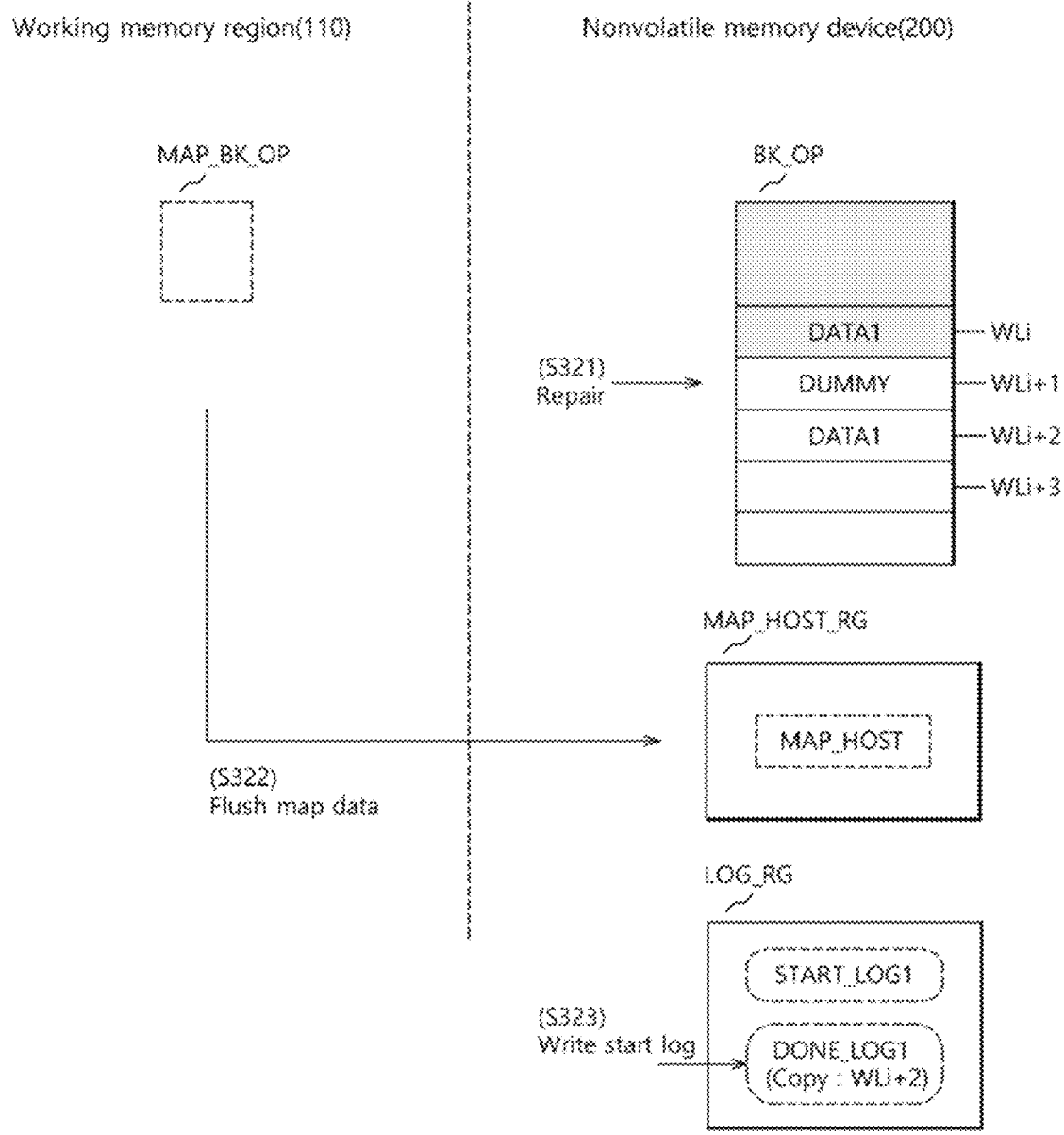
FIG. 8B is an explanatory diagram illustrating a method for performing the third recovery operation.

FIG. 8B illustrates in detail a method for the controller 100 to perform the third recovery operation. The third recovery operation may include the repair operation, the map data flush operation and the end log write operation for the open memory block BK_OP.

Referring to FIG. 8B, first, at step S321, the repair operation for the open memory block BK_OP may include the dummy write operation and the copy write operation. The controller 100 may perform the dummy write operation for the dummy word line WLi+1. Then, the controller 100 may perform the copy write operation for the copy word line WLi+2. The data stored through the copy write operation in memory regions corresponding to the copy word line WLi+2 may be the data stored in memory regions corresponding to the last word line WLi.

At step S322, the controller 100 may perform the map data flush operation for the block map data MAP_BK_OP of the memory block BK_OP recovered in the second recovery operation. The map data flush operation may be performed similarly to that described above with reference to FIG. 4B. The block map data MAP_BK_OP for which the map data flush operation has been performed may include not only the portion recovered in the second recovery operation but also map data relating to the memory regions corresponding to the copy word line WLi+2 for which the copy write operation has been performed.

At step S323, the controller 100 may write an end log DONE_LOG1 in the log memory region LOG_RG. The end log DONE_LOG1 may include information on the copy word line WLi+2. The end log DONE_LOG1 may be used to determine to which position the map data flush operation has been performed in the open memory block BK_OP.

According to an embodiment the end log DONE_LOG1 may include information on a new start word line instead of the copy word line WLi+2, that is, a word line WLi+3 subsequent to the copy word line WLi+2 according to the write sequence. Even when the end log DONE_LOG1 includes the information on the new start word line WLi+3 instead of the copy word line WLi+2, the controller 100 may clearly figure out that the map data flush operation is performed to before the new start word line WLi+3.

Figure 9:
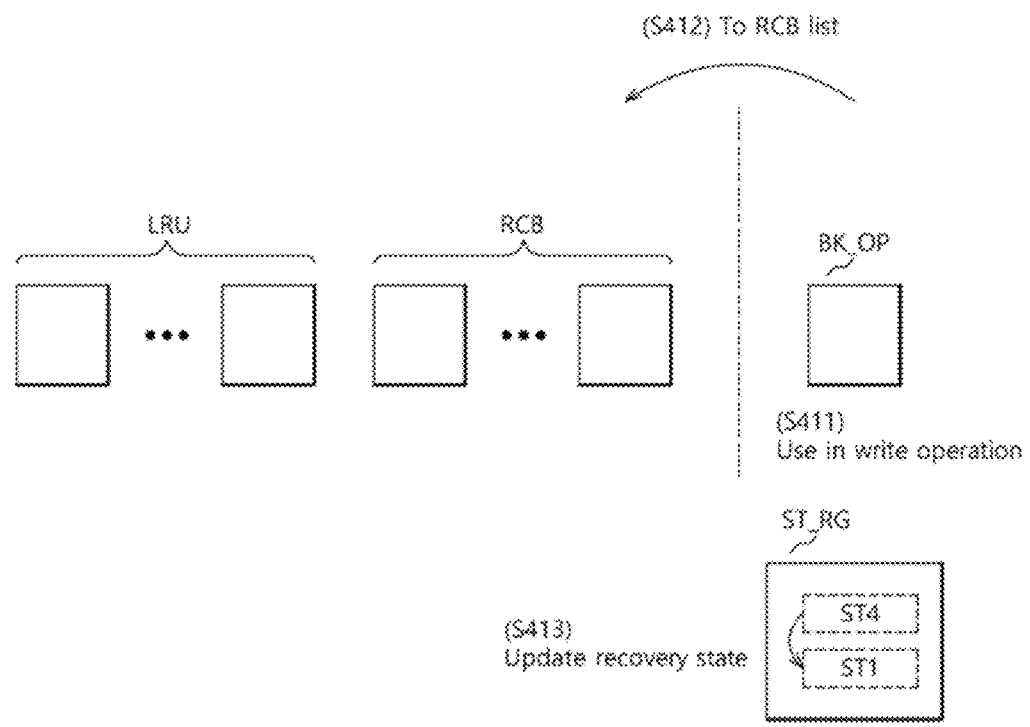
FIG. 9 is an explanatory diagram illustrating a method for the continuous use of a memory block in a fourth recovery state.

FIG. 9 illustrates a method for the controller 100 to use the memory block BK_OP in the fourth recovery state ST4. In FIG. 9, the data storage device 10 may be in the fourth recovery state ST4 as is updated in FIG. 8A.

Referring to FIG. 9, at step S411, the controller 100 may use the open memory block BK_OP for the write operation in the fourth recovery state ST4. The open memory block BK_OP may be in a state in which it may continue to be used from the new start word line WLi+3 through the repair operation of the third recovery operation.

At step S412, the controller 100 may close the memory block BK_OP and include it in the RCB list when there is no more empty memory region in the memory block BK_OP.

Then, at step S413, the controller 100 may update the fourth recovery state ST4 to the first recovery state ST1 in the state memory region ST_RG. When the data storage device 10 is updated to the first recovery state ST1, the entire recovery operation may be completed.

According to an embodiment, the controller 100 may simultaneously open two or more memory blocks. A plurality of open memory blocks may be designated in their uses. For example, the controller 100 may open one memory block to store the data transmitted from the host device, and simultaneously open another memory block to store the data moved in a garbage collection operation. In this case, when the controller 100 closes any one of memory blocks while continuously using the open memory blocks in the fourth recovery state, the controller 100 may update the fourth recovery state ST4 to the first recovery state ST1 in the state memory region ST_RG.

According to the above description, when a sudden power-off occurs, the controller 100 may update a recovery state while performing the recovery operation step by step. Therefore, the controller 100 may determine from which position the recovery operation will continue to be performed, by referring to the recovery state stored in the state memory region ST_RG, even though the recovery operation is interrupted again due to a subsequent sudden power-off occurring during the recovery operation.

First, in the case where a subsequent sudden power-off occurs while the first recovery operation is being performed in the first recovery state ST1, the controller 100 may perform again the first recovery operation described above with reference to FIGS. 6A and 6B as it is, in a booting operation after a power-on.

Also, in the case where a subsequent sudden power-off occurs while the second recovery operation is performed in the second recovery state ST2, the controller 100 may perform again the second recovery operation described above with reference to FIGS. 7A and 7B as it is, in a booting operation after a power-on.

Moreover, in the case where a subsequent sudden power-off occurs while the third recovery operation is performed in the third recovery state ST3, the controller 100 may perform a third subsequent recovery operation in a booting operation after a power-on. As will be described below with reference to FIGS. 10A and 10B, the third subsequent recovery operation may be similar to the third recovery operation described above with reference to FIGS. 8A and 8B, but may further include additional operations.

Figure 10A:
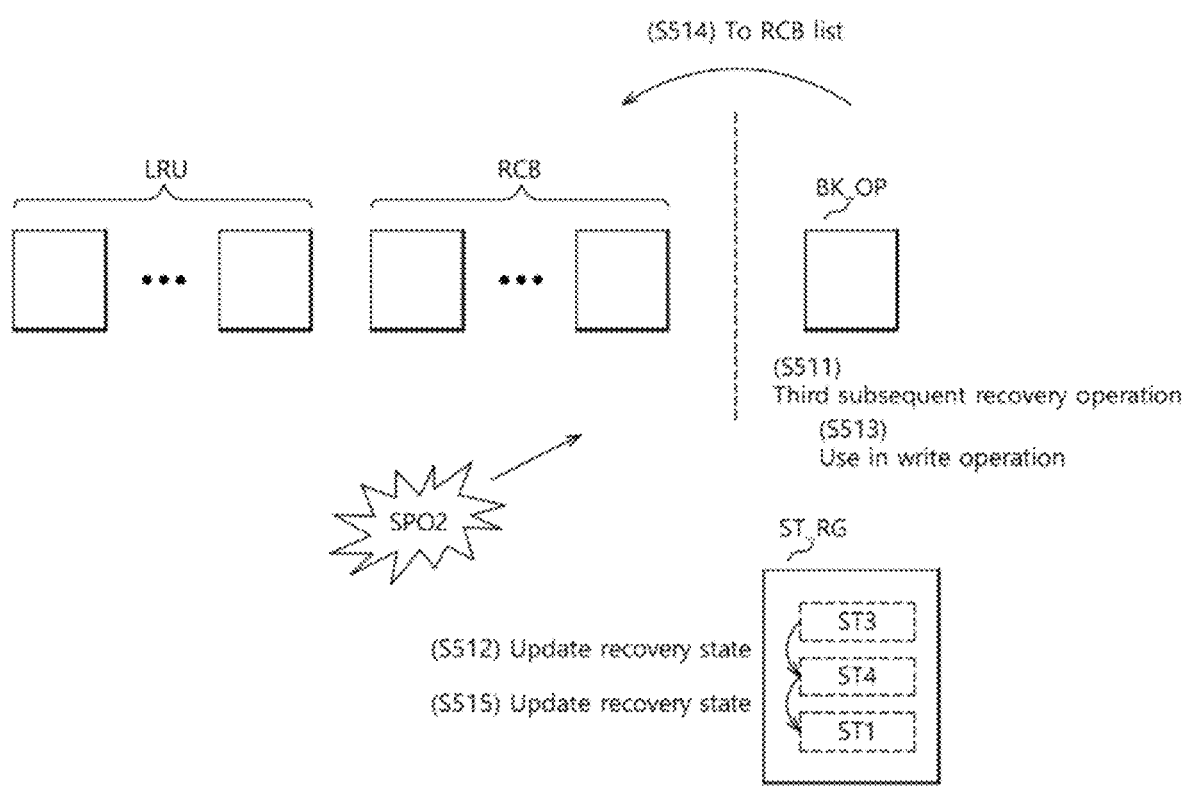
FIG. 10A is an explanatory diagram illustrating a method for performing a third subsequent recovery operation after a subsequent sudden power-off occurs in the third recovery state.

FIG. 10A illustrates a method for the controller 100 to perform a third subsequent recovery operation after a subsequent sudden power off SPO2 occurs in the third recovery state ST3.

Referring to FIG. 10A, at step S511, when it is determined in a booting operation that a sudden power-off SPO2 has occurred immediately before, the controller 100 may check by referring to the state memory region ST_RG that it is currently in the third recovery state ST3, and may start the third subsequent recovery operation. The third subsequent recovery operation may further include a start log rewrite operation for the open memory block BK_OP, in comparison with the third recovery operation described above with reference to FIGS. 8A and 8B. In detail, the controller 100 may correct a position where the repair operation is to be performed, based on the existing start log START_LOG1 written in the second repair operation, and rewrite a new start log including the corrected position. Thus, the rewritten start log may include information on a new copy word line of the open memory block BK_OP.

The third subsequent recovery operation may include the third recovery operation described above with reference to FIGS. 8A and 8B, that is, the repair operation, the map data flush operation and the end log write operation. In other words, the controller 100 may perform the repair operation, the map data flush operation and the end log write operation for the open memory block BK_OP, after performing the start log rewrite operation.

After completing the third subsequent recovery operation, at step S512, the controller 100 may update the third recovery state ST3 to the fourth recovery state ST4 in the state memory region ST_RG.

Thereafter, the controller 100 may continue using the open memory block BK_OP in the fourth recovery state ST4 as described above with reference to FIG. 9. Namely, at step S513, the controller 100 may use the open memory block BK_OP for the write operation. At step S514, the controller 100 may close the memory block BK_OP and include it in the RCB list when there is no more empty memory region in the memory block BK_OP. At step S515, the controller 100 may update the fourth recovery state ST4 to the first recovery state ST1 in the state memory region ST_RG. Then, the entire recovery operation may be completed.

Figure 10B:
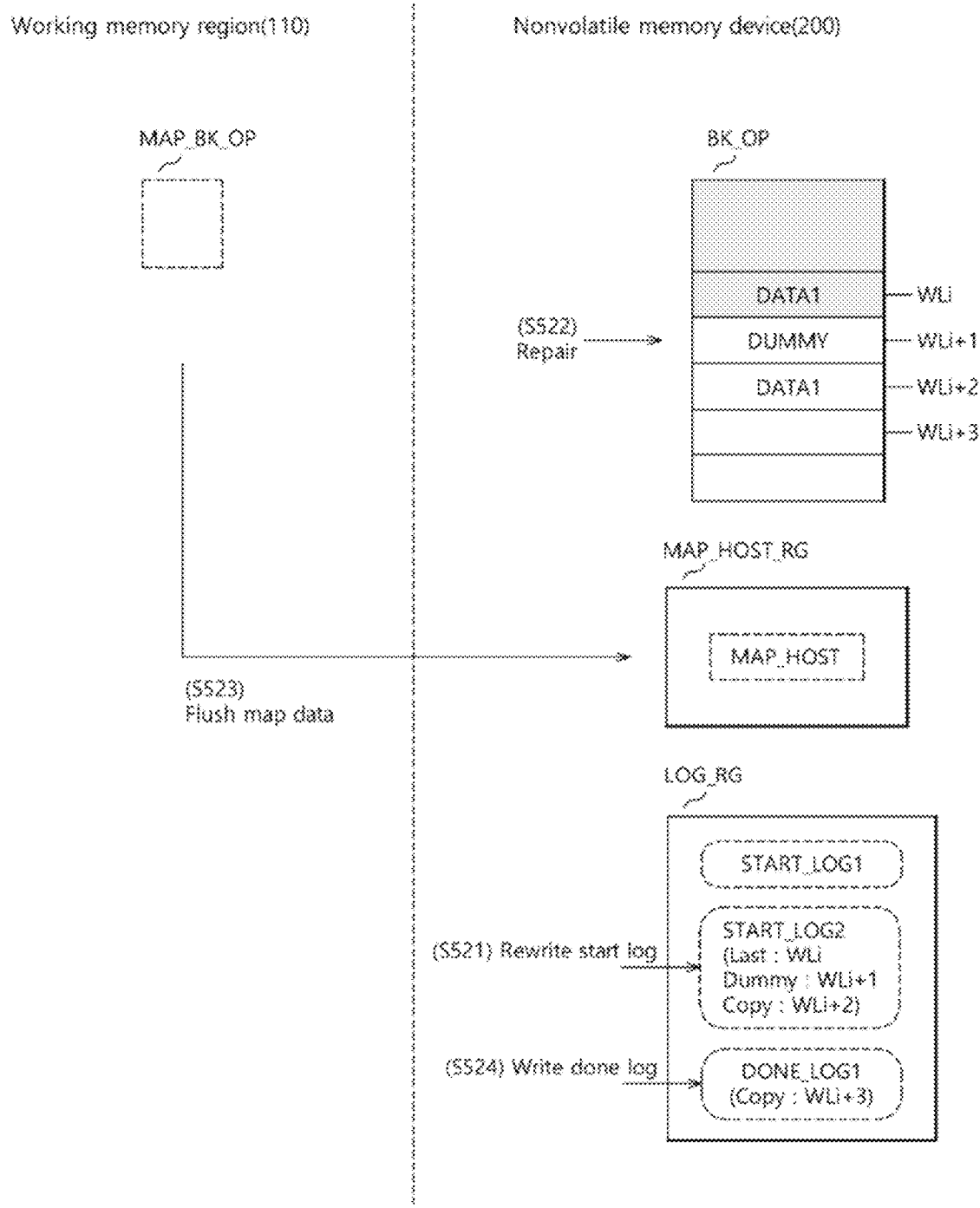
FIG. 10B is an explanatory diagram illustrating a method for performing the third subsequent recovery operation.

FIG. 10B illustrates in detail a method for the controller 100 to perform the third subsequent recovery operation. The third subsequent recovery operation may include the start log rewrite operation, the repair operation, the map data flush operation and the end log write operation for the open memory block BK_OP.

Referring to FIG. 10B, at step S521, the controller 100 may rewrite a start log START_LOG2 in the log memory region LOG_RG by referring to the start log START_LOG1. The rewritten start log START_LOG2 may include information on a new copy word line WLi+3, that is, a word line subsequent to the previous copy word line WLi+2 in the write sequence. That is to say, since the previous copy word line WLi+2 may be unstable to continue to perform the copy write operation in the case where a sudden power off occurs while the copy write operation is performed, the new copy word line WLi+3 may be determined. According to an embodiment, the previous copy word line WLi+2 may become a dummy word line for the dummy write operation.

At steps S522 to S524, the controller 100 may perform the repair operation, the map data flush operation and the end log write operation similarly to those described above with reference to FIG. 8B. Therefore, detailed descriptions thereof will be omitted herein.

Consideration may be made for a case where a subsequent sudden power-off occurs while using the open memory block BK_OP in the fourth recovery state ST4 after performing the recovery operation to the fourth recovery state ST4 after sudden power-off occurs. In this case, the controller 100 may perform a fourth subsequent recovery operation as will be described later with reference to FIG. 11, in a booting operation after a power-on.

Figure 11:
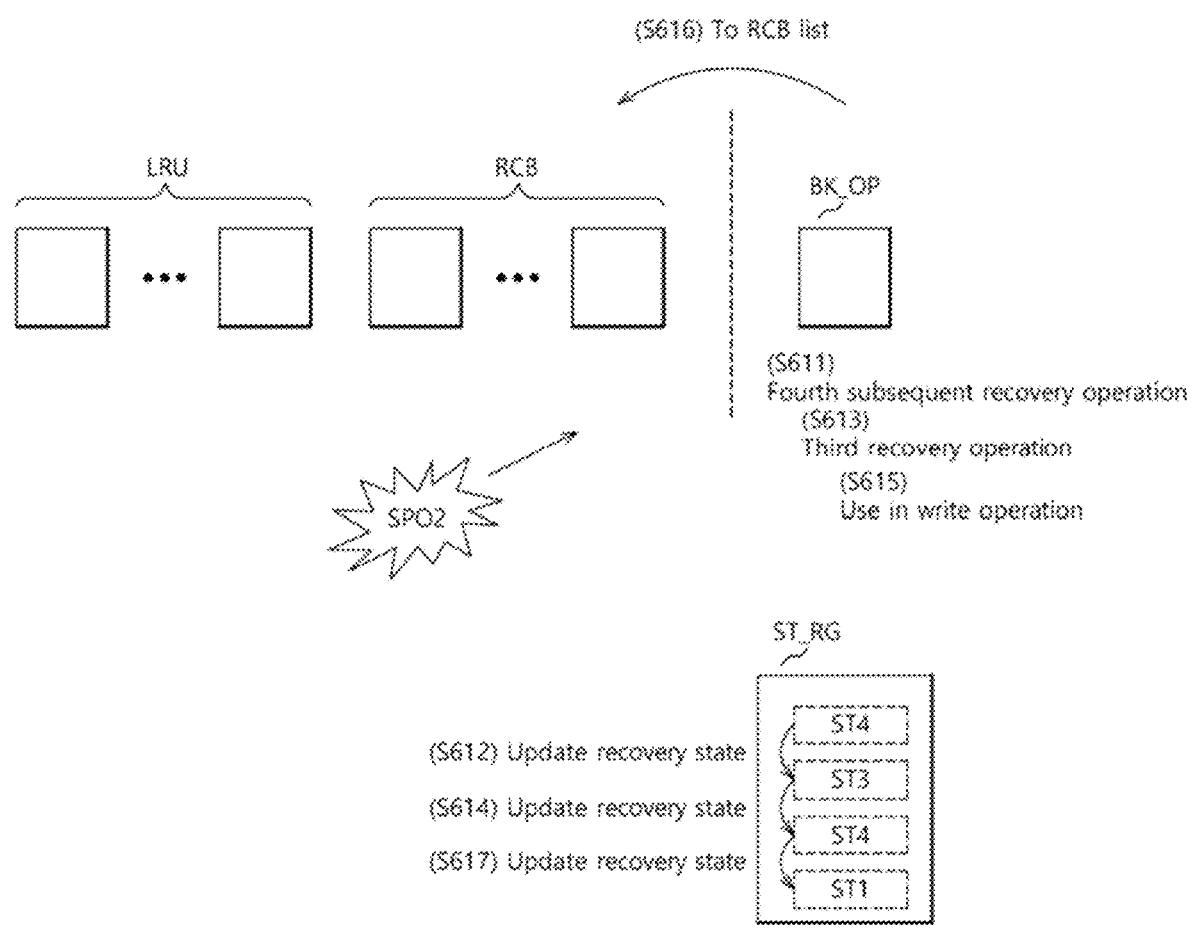
FIG. 11 is an explanatory diagram illustrating a method for performing a fourth subsequent recovery operation after a subsequent sudden power-off occurs while using an open memory block in the fourth recovery state.

FIG. 11 illustrates a method for the controller 100 to perform a fourth subsequent recovery operation after a subsequent sudden power-off SPO2 occurs again while using the open memory block BK_OP in the fourth recovery state ST4.

Referring to FIG. 11, at step S611, when it is determined in a booting operation that the sudden power-off SPO2 has occurred immediately before, the controller 100 may check by referring to the state memory region ST_RG that it is currently the fourth recovery state ST4, and may start the fourth subsequent recovery operation. The fourth subsequent recovery operation may include the block map data recovery operation and the start log write operation for the open memory block BK_OP. The block map data recovery operation and the start log write operation may be performed in a manner similar to that performed in the second recovery operation described above with reference to FIGS. 7A and 7B. Therefore, detailed descriptions thereof will be omitted herein.

After completing the fourth subsequent recovery operation, at step S612, the controller 100 may update the fourth recovery state ST4 to the third recovery state ST3 in the state memory region ST_RG.

At step S613, the controller 100 may perform the third recovery operation similarly to that described above with reference to FIGS. 8A and 8B. Namely, the third recovery operation may include the repair operation the map data flush operation and the end log write operation for the open memory block BK_OP.

In the case where the sudden power-off SPO2 occurs in the fourth recovery state ST4, at least one end log for the open memory block BK_OP may be already written in the log memory region LOG_RG. As described above, the end log may indicate to which position the map data flush operation has been performed previously in the open memory block BK_OP. Therefore, when performing the map data flush operation at step S613, the controller 100 may distinguish an already flushed portion and an unflushed portion in the block map data of the open block BK_OP, based on the previously recorded end log, and may perform the map data flush operation for only the unflushed portion. This may shorten a time required for the map data flush operation, and improve the efficiency of the recovery operation.

After completing the third recovery operation, at step S614, the controller 100 may update the third recovery state ST3 to the fourth recovery state ST4 in the state memory region ST_RG.

Thereafter, the controller 100 may continue using the open memory block BK_OP in the fourth recovery state ST4 as described above with reference to FIG. 9. Namely, at step S615, the controller 100 may use the open memory block BK_OP for the write operation. At step S616, the controller 100 may close the memory block BK_OP and include it in the RCB list when there is no more empty memory region in the memory block BK_OP. At step S617, the controller 100 may update the fourth recovery state ST4 to the first recovery state ST1 in the state memory region ST_RG. Then, the entire recovery operation may be completed.

Figure 12:
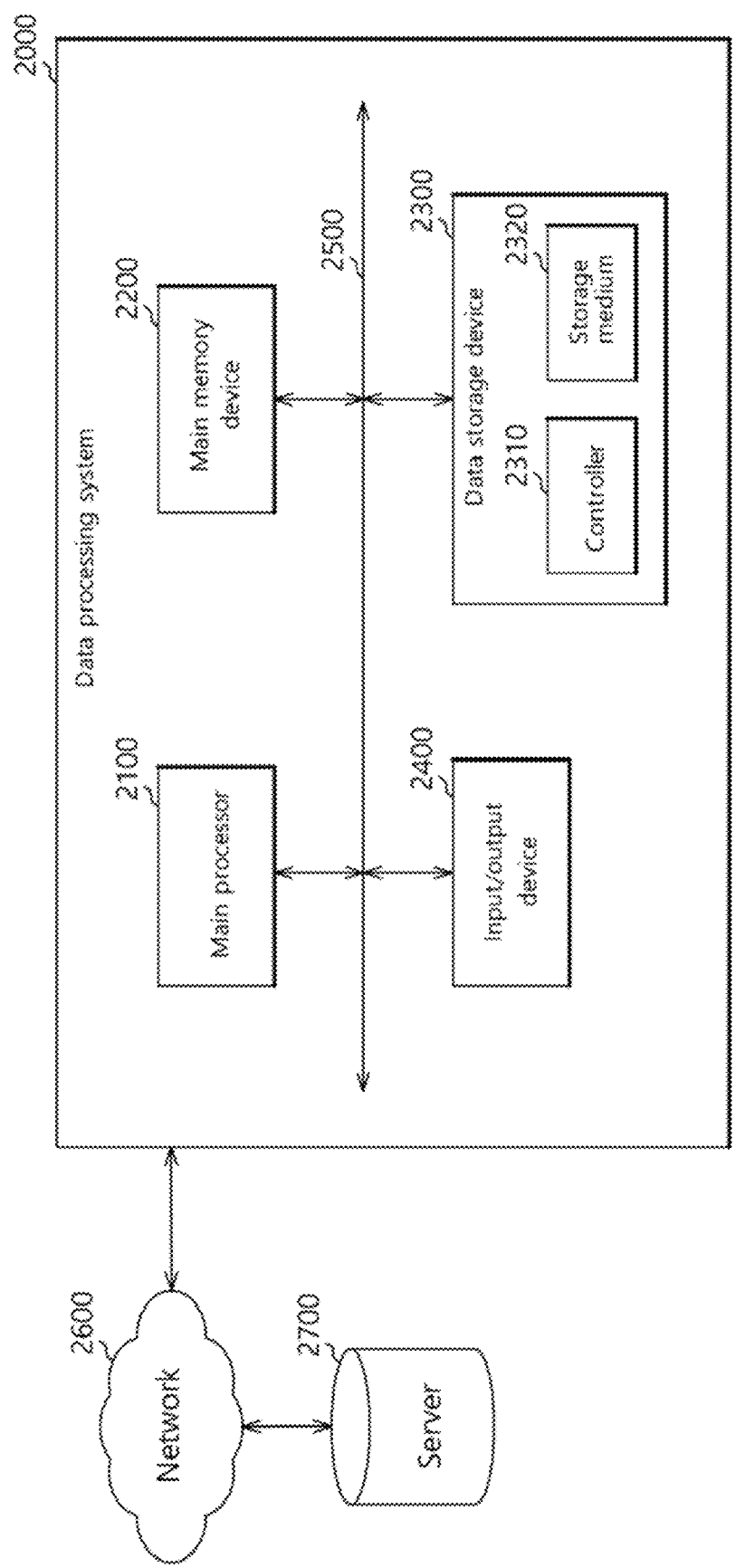
FIG. 12 is a block diagram illustrating a data processing system including a data storage device in accordance with an embodiment.

FIG. 12 is a block diagram illustrating a data processing system 2000 to which the data storage device 10 in accordance with the embodiment is applied.

The data processing system 2000 may include a computer, a laptop, a netbook, a smart phone, a digital TV, a digital camera, a navigator, etc. The data processing system 2000 may include a main processor 2100, a main memory device 2200, a data storage device 2300, and an input/output device 2400. The internal units of the data processing system 2000 may exchange data, control signals, etc. through a system bus 2500.

The main processor 2100 may control general operations of the data processing system 2000. The main processor 2100 may be a central processing unit, for example, such as a microprocessor. The main processor 2100 may execute softwares such as an operation system, an application, a device driver, and so forth, on the main memory device 2200.

The main memory device 2200 may store programs and program data to be used by the main processor 2100. The main memory device 2200 may temporarily store data to be transmitted to the data storage device 2300 and the input/output device 2400.

The data storage device 2300 may include a controller 2310 and a storage medium 2320. The data storage device 2300 may be configured and operate substantially similarly to the data storage device 10 of FIG. 1.

The input/output device 2400 may include a keyboard, a scanner, a touch screen, a screen monitor, a printer, a mouse, or the like, capable of exchanging data with a user, such as receiving a command for controlling the data processing system 2000 from the user or providing a processed result to the user.

According to an embodiment, the data processing system 2000 may communicate with at least one server 2700 through a network 2600 such as a Local Area Network (LAN), a Wide Area Network (WAN), a wireless network, and so on. The data processing system 2000 may include a network interface (not shown) to access the network 2600.

While various embodiments have been described above, it will be understood to those skilled in the art that the embodiments described are examples only. Accordingly, the data storage device and the operating method thereof described herein should not be limited based on the described embodiments.

What is claimed is:

1. A data storage device comprising:
   a nonvolatile memory device; and
   a controller suitable for:
   performing a recovery operation for the nonvolatile memory device based on a recovery state of the nonvolatile memory device in a booting operation after a sudden power-off, the performing of the recovery operation including: writing a start log including a position where a repair operation is to be performed in at least one open memory block of the nonvolatile memory device; performing the repair operation; and updating the recovery state to a predetermined recovery state; and
   performing a write operation to a part extending from the position where the repair operation is performed in the at least one open memory block, in the predetermined recovery state.

2. The data storage device according to claim 1, wherein, when the recovery state is a first recovery state, the controller is further suitable for:
   flushing block map data of at least one closed memory block included in a predetermined list; and
   updating the first recovery state to a second recovery state.

3. The data storage device according to claim 2, wherein, after the first recovery state is updated to the second recovery state or when the nonvolatile memory device is in the second recovery state, the controller is further suitable for:
   recovering block map data of the open memory block, writing the start log; and
   updating the second recovery state to a third recovery state.

4. The data storage device according to claim 3, wherein, after updating the recovery state to the third recovery state, the controller is further suitable for:
   performing the repair operation;
   flushing the block map data of the open memory block, writing an end log including a performance result of the repair operation; and
   updating the third recovery state to the predetermined recovery state.

5. The data storage device according to claim 3, wherein, when the recovery state is the third recovery state, the controller is further suitable for:
   correcting a position where the repair operation is to be performed, based on the start log, before performing the repair operation; and
   rewriting a new start log including a corrected position.

6. The data storage device according to claim 2, wherein, when the recovery state is the predetermined recovery state, the controller is further suitable for:
   recovering block map data of the open memory block;
   writing a new start log including a position where the repair operation is to be performed; and
   updating the predetermined recovery state to a third recovery state.

7. The data storage device according to claim 6, wherein, after updating the recovery state to the third recovery state, the controller is further suitable for:
   performing the repair operation;
   flushing the block map data of the open memory block;
   writing an end log including a performance result of the repair operation; and updating the third recovery state to the predetermined recovery state.

8. The data storage device according to claim 7, wherein, when flushing the block map data, the controller is further suitable for:
   determining an already flushed portion in the block map data, based on a previously stored end log; and
   flushing a portion not flushed in the block map data.

9. The data storage device according to claim 1,
   wherein, when the open memory block does not include an empty memory region in the predetermined recovery state, the controller includes the open memory block in a predetermined list, and is further suitable for updating the predetermined recovery state to a first recovery state, and
   wherein the predetermined list includes at least one memory block of which block map data is not flushed.

10. The data storage device according to claim 1,
    wherein, when performing the repair operation, the controller is further suitable for:
    performing a dummy write operation to a first word line subsequent to a most recently written word line in the open memory block; and
    performing a copy write operation for a second word line subsequent to the first word line, and
    wherein, when performing the copy write operation, the controller copies data stored in memory regions of the lastly written word line.

11. A method for operating a data storage device, comprising:
    starting a recovery operation depending on a recovery state for a nonvolatile memory device including a plurality of memory blocks, in a booting operation after a sudden power-off;
    writing a start log including a position where a repair operation is to be performed in at least one open memory block, performing the repair operation, and updating the recovery state to a predetermined recovery state; and
    performing a write operation to a part extending from the position where the repair operation is performed in the at least one open memory block, in the predetermined recovery state.

12. The method according to claim 11, further comprising:
    when the recovery state is a first recovery state, flushing block map data of at least one closed memory block included in a predetermined list; and
    updating the first recovery state to a second recovery state.

13. The method according to claim 12, further comprising:
    after the first recovery state is updated to the second recovery state or when the recovery state is the second recovery state,
    recovering block map data of the open memory block, writing the start log, and
    updating the second recovery state to a third recovery state.

14. The method according to claim 13, further comprising:
    after updating the recovery state to the third recovery state,
    performing the repair operation;
    flushing the block map data of the open memory block;
    writing an end log including a performance result of the repair operation; and
    updating the third recovery state to the predetermined recovery state.

15. The method according to claim 13, further comprising:
    when the recovery state is the third recovery state,
    correcting a position where the repair operation is to be performed, based on the start log, before performing the repair operation; and
    rewriting a new start log including a corrected position.

16. The method according to claim 12, further comprising:
    when the recovery state is the predetermined recovery state,
    recovering block map data of the open memory block, writing a new start log including a position where the repair operation is to be performed; and
    updating the predetermined recovery state to a third recovery state.

17. The method according to claim 16, further comprising:
    after updating the recovery state to the third recovery state,
    performing the repair operation;
    flushing the block map data of the open memory block;
    writing an end log including a performance result of the repair operation; and
    updating the third recovery state to the predetermined recovery state.

18. The method according to claim 17, wherein the flushing of the block map data comprises:
    determining an already flushed portion in the block map data, based on a previously stored end log; and
    flushing a portion not flushed in the block map data.

19. The method according to claim 11, further comprising:
    when the open memory block does not include an empty memory region in the predetermined recovery state,
    including the open memory block in the predetermined list; and
    updating the predetermined recovery state to a first recovery state, and
    wherein the predetermined list includes at least one memory block of which block map data is not flushed.

20. The method according to claim 11,
    wherein the repair operation comprises a dummy write operation to a first word line subsequent to a most recently written word line in the open memory block, and a copy write operation for a second word line subsequent to the first word line, and
    wherein the copy write operation is performed by copying data stored in memory regions of the lastly written word line.

* * * * *

UNITED STATES PATENT AND TRADEMARK OFFICE
CERTIFICATE OF CORRECTION

PATENT NO. : 10,664,355 B2
APPLICATION NO. : 15/829081
DATED : May 26, 2020
INVENTOR(S) : Duck Hoi Koo and Seung Gu Ji Page 1 of 1

It is certified that error appears in the above-identified patent and that said Letters Patent is hereby corrected as shown below:

On the Title Page

Item (73) should read:
(73) Assignee: SK hynix Inc., Gyeonggi-do (KR)

Signed and Sealed this
Eighth Day of December, 2020

Andrei Iancu
*Director of the United States Patent and Trademark Office*